United States Patent
Wojcik et al.

(10) Patent No.: US 9,379,517 B2
(45) Date of Patent: Jun. 28, 2016

(54) RADIATION-EMITTING COMPONENT

(71) Applicant: OSRAM Opto Semiconductors GmbH, Regensburg (DE)

(72) Inventors: Andreas Wojcik, Regensburg (DE); Josip Maric, Sinzing (DE); Martin Haushalter, Regensburg (DE); Frank Möllmer, Matting Bei Pentling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/352,677

(22) PCT Filed: Sep. 27, 2012

(86) PCT No.: PCT/EP2012/069134
§ 371 (c)(1),
(2) Date: Apr. 17, 2014

(87) PCT Pub. No.: WO2013/056967
PCT Pub. Date: Apr. 25, 2013

(65) Prior Publication Data
US 2014/0307755 A1  Oct. 16, 2014

(30) Foreign Application Priority Data
Oct. 20, 2011 (DE) .................. 10 2011 116 534

(51) Int. Cl.
*H01S 3/00* (2006.01)
*H01S 5/022* (2006.01)
*H01S 5/042* (2006.01)

(52) U.S. Cl.
CPC ......... *H01S 5/02236* (2013.01); *H01S 5/02228* (2013.01); *H01S 5/02244* (2013.01); *H01L 2924/0002* (2013.01); *H01S 5/02296* (2013.01); *H01S 5/0428* (2013.01)

(58) Field of Classification Search
CPC ....... H01S 3/02; H01S 3/06704; H01S 3/022; H01S 3/027; H01S 3/0608; H01S 5/02208; H01S 5/02216; H01S 5/02236; H01S 5/02228; H01S 5/02244; H01S 5/02296; H01S 5/0428; H01L 2924/0002
USPC ...................................................... 372/38.02
See application file for complete search history.

(56) References Cited

U.S. PATENT DOCUMENTS 5,689,520 A * 11/1997 Hoang ................. 372/29.02
5,838,703 A   11/1998 Lebby et al.
(Continued)

FOREIGN PATENT DOCUMENTS

CN         1926694 A    3/2007
DE      10006738 A1    9/2001
(Continued)

OTHER PUBLICATIONS

"Through-hole technology", http://en.wikipedia.org/wiki/Through-hole_technology, pp. 1-2.
(Continued)

*Primary Examiner* — Jessica Stultz
*Assistant Examiner* — Vu A Vu
(74) *Attorney, Agent, or Firm* — McDermott Will & Emery LLP

(57) ABSTRACT

A radiation-emitting component is specified, having a metallic carrier body (1), which comprises at least two connection locations (1a, 1b) for making electrical contact with the component, a laser diode chip (2), which is fixed to the metallic carrier body (1) and is electrically conductively connected to the at least two connection locations (1a, 1b), a housing (3), which surrounds the metallic carrier body (1) in places, wherein the housing (3) is formed with a plastic, the connection locations (1a, 1b) extend in each case at least in places along a bottom face (3a) and a side face (3b) of the housing (3), said side face running transversely with respect to the bottom face, and the component is surface-mountable by means of the connection locations (1a, 1b) in such a way that the bottom face (3a) or the side face (3b) forms a mounting face of the component.

11 Claims, 9 Drawing Sheets

(56) References Cited

U.S. PATENT DOCUMENTS

Figure 1A:
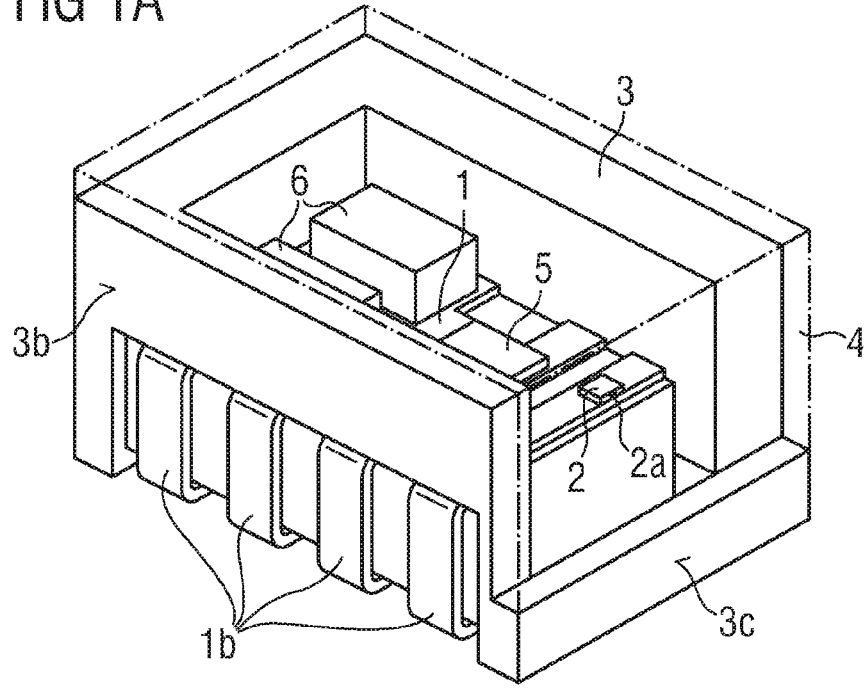
Figure 1B:
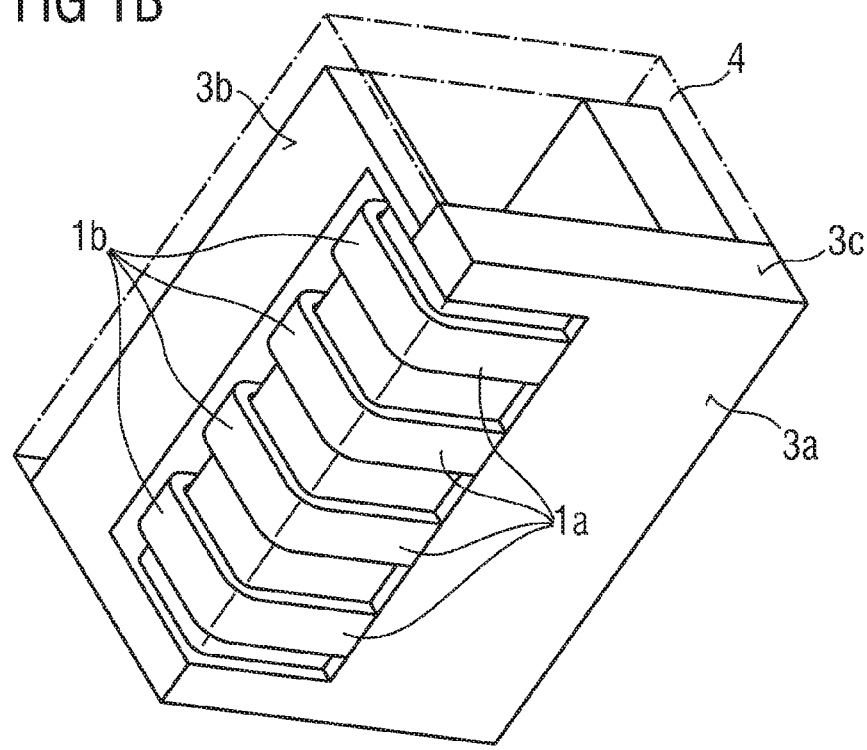

| | | |
|---|---|---|
| 5,844,257 A | 12/1998 | Chen |
| 6,008,529 A | 12/1999 | Wu |
| 6,624,491 B2 | 9/2003 | Waitl et al. |
| 7,781,727 B2 * | 8/2010 | Sherrer et al. .................. 250/239 |
| 7,812,364 B2 * | 10/2010 | Seko et al. ....................... 257/99 |
| 2004/0032888 A1 | 2/2004 | Ferstl |
| 2006/0078248 A1 | 4/2006 | Sasaki et al. |
| 2007/0238328 A1 * | 10/2007 | Ferstl .............................. 439/83 |
| 2007/0269927 A1 | 11/2007 | Hofer et al. |
| 2007/0284708 A1 | 12/2007 | Hanya |
| 2008/0230790 A1 | 9/2008 | Seko et al. |
| 2010/0238384 A1 * | 9/2010 | Tochigi et al. .................. 349/96 |
| 2011/0079801 A1 | 4/2011 | Zhang et al. |

FOREIGN PATENT DOCUMENTS

| | | |
|---|---|---|
| DE | 10122002 A1 | 11/2002 |
| DE | 102006032416 A1 | 4/2007 |
| DE | 102007062044 A1 | 6/2009 |
| JE | H08264885 A | 10/1996 |
| JP | 2003513463 A | 4/2003 |
| JP | 2008235826 A | 10/2008 |
| JP | 2011091344 A | 5/2011 |
| WO | 02/17451 A1 | 2/2002 |

OTHER PUBLICATIONS

"TO-56, 2.5 Gb/s VCSEL" Emcore Corporation, Jun. 2003, pp. 1-3.

* cited by examiner

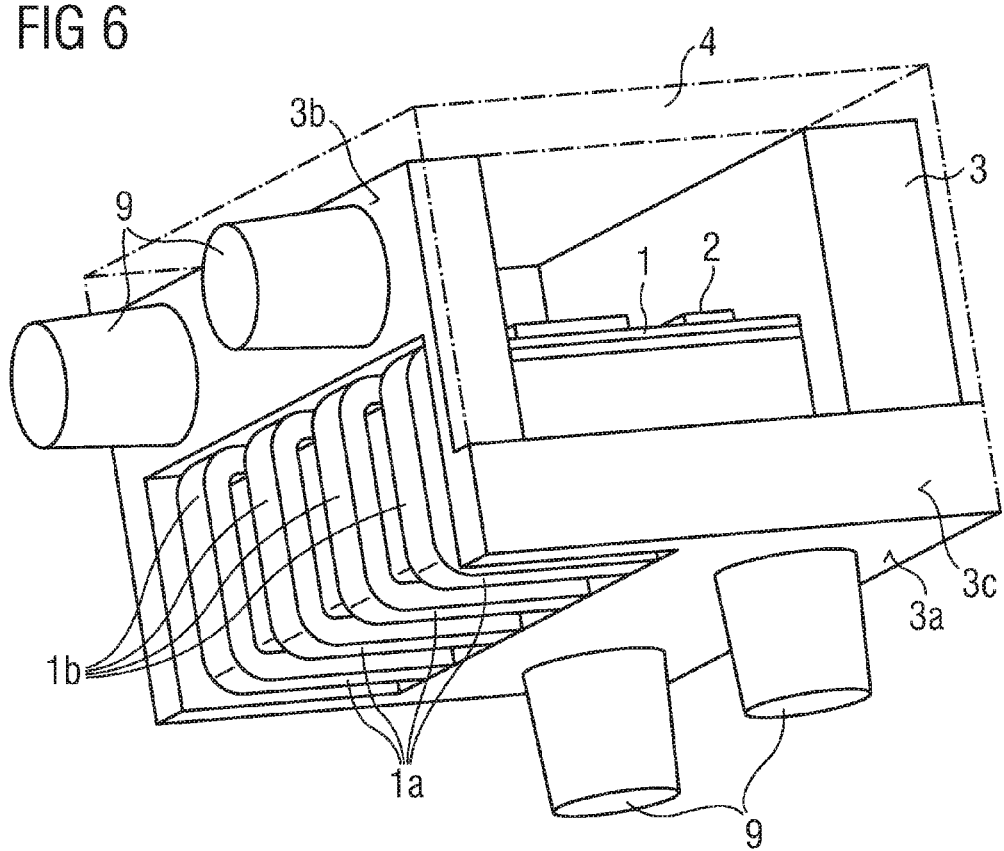

FIG 7A
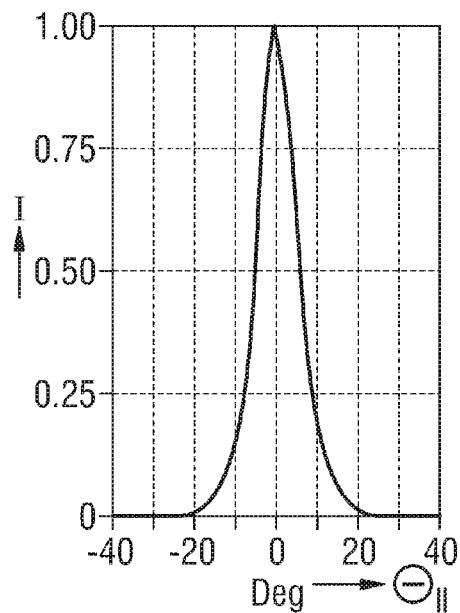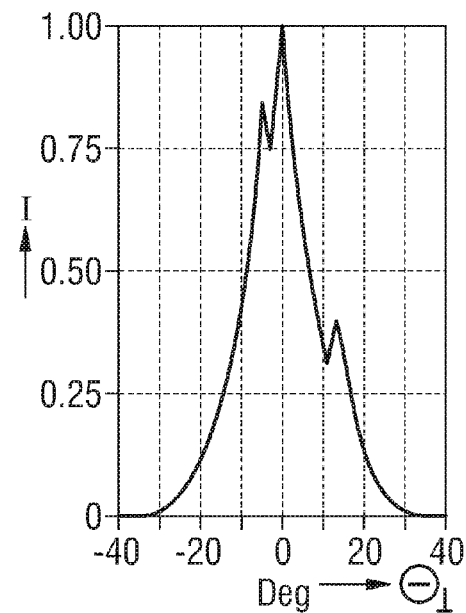
FIG 7B
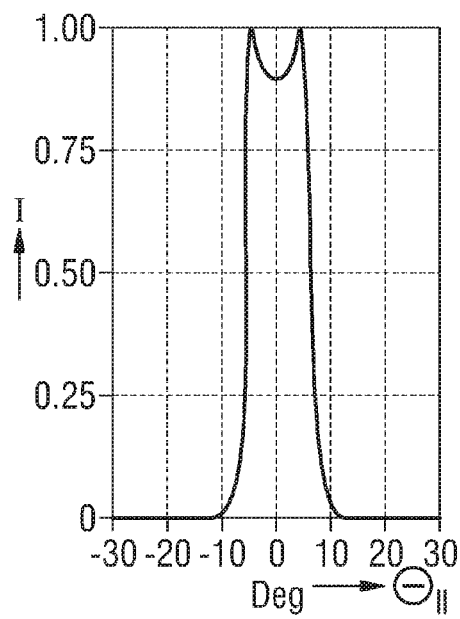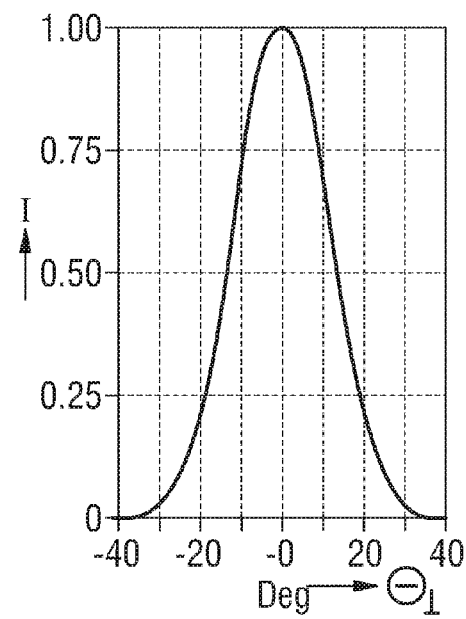

RADIATION-EMITTING COMPONENT

A radiation-emitting component is specified.

The document WO 02/17451 A1 describes a radiation-emitting component.

One object to be achieved is to specify a radiation-emitting component which can be used particularly versatilely.

In accordance with at least one embodiment of the radiation-emitting component, the radiation-emitting component comprises a metallic carrier body. The metallic carrier body can consist of a metal, for example. Furthermore, it is possible for the metallic carrier body to be formed with a base material coated with a metal at its outer surface. The base material can also be a metal, for example, which differs from the metal at the outer surface. In any case, the metallic carrier body has metallic properties at least at its outer surface.

In this case, the metallic carrier body is preferably embodied in a multipartite fashion. In this case, the parts of the metallic carrier body are not directly electrically conductively connected to one another. That is to say that only electrical connection of the radiation-emitting component at the intended location produces an electrically conductive connection between said parts of the metallic carrier body. Furthermore, parts of the metallic carrier body which are not electrically connected to one another can be connected to one another by contact wires (so-called bonding wires, for example composed of gold).

The metallic carrier body is embodied, for example, as a so-called leadframe. That is to say that the metallic carrier body is then formed by a structured metal strip. The metallic carrier body comprises at least two connection locations for making electrical contact with the component. Electrical contact can be made with the radiation-emitting component from outside via the two connection locations, that is to say that the at least two connection locations are electrically conductively connected to active components of the radiation-emitting component.

In accordance with at least one configurations of the radiation-emitting component, the radiation-emitting component comprises a laser diode chip, which is fixed to the metallic carrier body. In this case, the laser diode chip is electrically conductively connected to the at least two connection locations via the metallic carrier body. The laser diode chip is an edge emitting semiconductor laser diode, for example.

The laser diode chip can be suitable for generating electromagnetic radiation in the spectrum from UV radiation to infrared radiation during operation. In particular, the laser diode chip can also be suitable for generating colored light, such as, for example, red, blue or green light.

In order to fix the laser diode chip to the metallic carrier body, it can be fixed to the metallic carrier body by soldering or adhesive bonding, for example. In this case, it is possible for an electrically conductive contact between the laser diode chip and the metallic carrier body also to be imparted via a connecting means arranged between laser diode chip and metallic carrier body. The connecting means can then be, in particular, an electrically conductive solder or an electrically conductive adhesive.

In accordance with at least one embodiment of the radiation-emitting component, the radiation-emitting component comprises a housing, which surrounds the metallic carrier body in places. The housing forms at least one part of the outer surface of the radiation-emitting component. In this case, the metallic carrier body can adjoin the housing in places directly and in a positively locking manner and, for connection to the housing, for example, can be embedded into said housing. For this purpose, the metallic carrier body can be encapsulated with the material of the housing by injection molding, for example.

Parts of the metallic carrier body, for example at least the connection locations for making electrical contact with the component, are not covered by the housing and are freely accessible at least in places from outside the radiation-emitting component. If the metallic carrier body is embodied in a multipartite fashion, a mechanical cohesion of the parts of the metallic carrier body can be imparted by the housing.

The housing can be embodied like a cube or parallelepiped, for example, with regard to its basic form. The radiation-emitting component can thus be installed particularly simply since this outer form enables the radiation-emitting component to be gripped simply and precisely.

The housing does not completely surround the metallic carrier body and the components applied on the metallic carrier body, rather it has at least one opening, for example, through which electromagnetic radiation generated by the laser diode chip during operation can penetrate toward the outside.

In accordance with at least one embodiment of the radiation-emitting component, the housing is formed with a plastic. In this case, the housing can be embodied as a so-called premold housing. In this case, the housing is produced by means of transfer molding or injection molding, for example.

By way of example, the housing is produced by the encapsulation of the metallic carrier body, that is to say for example of an already structured metal strip, with the housing material by injection molding. This gives rise to a housing having at least one cavity in which the active elements of the housing can be arranged. By way of example, the laser diode chip is arranged in the housing cavity.

Parts of the metallic carrier body run through the housing and, at that side of the housing which faces away from the active components, in particular the laser diode chip, form in particular the connection locations for making electrical contact with the component, at which connection locations electrical contact can be made with the radiation-emitting component from outside.

By way of example, a liquid crystal polymer or some other plastic can be used for forming the housing.

In accordance with at least one embodiment of the radiation-emitting component, the connection locations extend in each case at least in places along a bottom face and a side face of the housing, said side face running transversely with respect to the bottom face. In this case, the bottom face and the side face of the housing directly adjoin one another and can, for example, also be perpendicular to one another. The connection locations therefore do not run only along a bottom face or only along a side face, but rather span at least in places at least two faces delimiting the housing toward the outside.

In accordance with at least one embodiment of the radiation-emitting component, the component is surface-mountable by means of the connection locations in such a way that the bottom face or the side face forms a mounting face of the component. That is to say that the radiation-emitting component can be fixed and electrically contact-connected at the desired location of use by means of surface-mounting technology (SMT). The radiation-emitting component is therefore a surface-mountable component (surface-mounted device, SMD).

In this case, the radiation-emitting component can be mounted in at least two, in particular exactly two, orientations at the target location. Either the bottom face forms a mounting face of the component or the side face running transversely with respect to the bottom face forms the mounting face.

Therefore, the component can be mounted—depending on the course of the bottom face relative to the side face—in at least two different orientations. This is made possible, in particular, by virtue of the fact that the connection locations extend both along the bottom face and along the side face.

In accordance with at least one embodiment of the radiation-emitting component, the radiation-emitting component comprises a metallic carrier body, which comprises at least two connection locations for making electrical contact with the component, a laser diode chip, which is fixed to the metallic carrier body and is electrically conductively connected to the at least two connection locations, and a housing, which surrounds the metallic carrier body in places. In this case, the housing is formed with a plastic, the connection locations extend in each case at least in places along a bottom face and a side face of the housing, said side face running transversely with respect to the bottom face, and the component is surface-mountable by means of the connection locations in such a way that the bottom face or the side face forms a mounting face of the component.

In this case, one concept underlying a radiation-emitting component described here is that, by means of the component being mounted with the bottom face as mounting face or the side face as mounting face, the emission characteristic of the component can be adapted to the conditions of use for the component in a particularly simple manner. A laser diode chip has different divergence angles (so-called fast axis and slow axis) parallel and respectively perpendicular to the active region, for example a pn junction. The desired orientation of the divergence angles in space varies depending on the desired application. As a result of the radiation-emitting component being mounted with the bottom face or the side face as mounting face, the directions in which larger or smaller divergence angles are intended to arise can be selected in a simple manner. By way of example, the bottom face of the housing runs parallel to the pn junction of the active zone. The side face of the housing can then run transversely, in particular perpendicularly, with respect to the pn junction.

In accordance with at least one embodiment of the radiation-emitting component, regions of the laser diode chip which do not face the metallic carrier body adjoin air or some other gas. In other words, the laser diode chip in the present case is not potted with a radiation-transmissive material; rather, apart from where said laser diode chip is fixed to the metallic carrier body, the laser diode chip has exposed and freely accessible outer surfaces. That is to say that there is no direct contact between the laser diode chip and, for example, a plastic that forms the housing of the radiation-emitting component. In this way, it is also not possible for mechanical stress to occur on account of different coefficients of linear expansion between the semiconductor material of the laser diode chip and the plastic. The radiation-emitting component embodied in this way, wherein the laser diode chip adjoins air or some other gas at least in places, is therefore distinguished by a particularly high aging stability and failsafety.

In accordance with at least one embodiment of the radiation-emitting component, in each case at least one fitting pin is formed at the bottom face and at the side face of the housing. In this case, the fitting pin can be an integral part of the housing, that is to say that the fitting pin can be formed in one piece with the housing and consist of the same material as the housing.

By way of example, in each case two fitting pins are formed at the bottom face and at the side face along which the connection locations extend at least in places. By means of the fitting pins, the radiation-emitting component can be aligned during the mounting of the component. That is to say that a positively locking positioning into corresponding holes in, for example, a printed circuit board can be effected by means of the fitting pins attached to the housing or integrated into the housing.

In this way, the radiation-emitting component can be mounted at the intended location particularly precisely, without the need for complex alignment. Since a housing embodied as a premold housing has particularly small manufacturing tolerances, the radiation-emitting component can be aligned at the intended location particularly precisely without high alignment complexity if the housing is a premold housing and has fitting pins at the bottom face and the side face for mounting purposes.

In accordance with at least one embodiment of the radiation-emitting component, the radiation-emitting component comprises a radiation exit window at a further side face of the housing, wherein the radiation exit window faces a radiation exit face of the laser diode chip. That is to say that the radiation exit window is disposed downstream of the laser diode chip in the emission direction thereof, and at least a large part of the electromagnetic radiation emitted by the laser diode chip during operation impinges on the radiation exit window. A large part of the radiation impinging on the radiation exit window, preferably at least 75% of said radiation, emerges through the radiation exit window and leaves the radiation-emitting component in this way.

The radiation exit window, at least in the region of a radiation passage of the electromagnetic radiation generated by the laser diode chip during operation, is embodied as transmissive to said radiation. The housing is not present in the region of the radiation exit window; by way of example, as early as during the production of the housing, one side face is produced which is lowered relative to other side faces of the housing and which is adjoined by the radiation exit window. The radiation exit window can be formed for this purpose for example with a clearly transparent housing cover.

In accordance with at least one embodiment of the radiation-emitting component, the radiation exit window, at least in the region of the radiation passage, has a mean roughness set in a targeted manner. That is to say that the radiation exit window, in the region of the radiation passage, is not embodied in a smooth fashion, but rather roughened in a targeted manner.

It has been established in this case that a roughening of the radiation exit window, at least where radiation passes through the radiation exit window, can homogenize an inhomogeneous intensity profile of the electromagnetic radiation generated by the laser diode chip during operation. Particularly if the laser diode chip is a broad-stripe laser or a multimode laser, the observer can perceive local maxima, so-called hot spots, in the far field. These inhomogeneities can be reduced as a result of the targeted roughening, at least in the region of the radiation passage.

In this case, the roughening is preferably statistical, that is to say that no periodicity of the roughening can be discerned by means of analysis methods such as a Fourier transformation, for example. The mean roughness of the roughening is in the range of the wavelength of the electromagnetic radiation generated by the laser diode chip during operation. In particular, the mean roughness can in this case be from a range of at least 0.5 to at most 1.5 of a peak wavelength of the radiation generated by the laser diode chip during operation. The peak wavelength is the wavelength of greatest intensity of the emitted radiation. Preferably, the mean roughness is in a range of at least 0.75 to at most 1.25 of the peak wavelength of the radiation generated by the laser diode chip during operation.

In accordance with at least one embodiment of the radiation-emitting component, the radiation-emitting component comprises a transistor for switching the laser diode chip, and a parallel connection of at least two capacitors for supplying the laser diode chip with energy, wherein the transistor and the capacitors are fixed on the metallic carrier and are electrically conductively connected to the at least two connection locations, and the component is suitable for generating laser pulses.

The use of a plurality of capacitors, in particular, can shorten the time constant of a discharge of the electrical energy stored in the capacitors, that is to say the time constant of the impression of the electric current into the laser diode chip. On account of the fact that the transistor, the capacitors and the connection locations are arranged on the same metallic carrier and thus particularly close together spatially, the signal paths in the radiation-emitting component are reduced, which reduces the inductance of the system and enables a particularly short sequence of laser pulses. By way of example, the radiation-emitting component in this way can be suitable for generating nanosecond laser pulses.

The radiation-emitting component described here is distinguished, in particular, by its small outer dimensions, which enable the component parts of the radiation-emitting component, such as the transistor, the capacitors and the laser diode chip, to be arranged particularly close together spatially. By way of example, the length of the radiation-emitting component is between at least 7.5 and at most 12.5 mm, the width is between at least 5 and at most 9 mm, and the height is between at least 3 and at most 7 mm. In the case of such a radiation-emitting component, it is possible for transistor, capacitor and laser diode chip to be arranged mutually at distances relative to one another which are less than or equal to 10 mm, preferably less than or equal to 7 mm. That is to say that the distance between said component parts is in pairs less than or equal to 10 mm, preferably less than or equal to 7 mm. This enables particularly short switching times.

In accordance with at least one embodiment of the radiation-emitting component, the transistor is electrically conductively connected to the laser diode chip via at least two contact wires. The contact wires can be formed in each case at regions of the metallic carrier body which are in each case electrically conductively connected to the transistor and respectively the laser diode chip. The use of a plurality of contact wires makes it possible to further reduce the inductance, which enables a particularly fast pulse sequence of the laser pulses.

In the case of the radiation-emitting component described here, it is furthermore possible for the radiation-emitting component to comprise two or more laser diode chips. In this case, the laser diode chips can be embodied such that they are of identical type, that is to say for example generate radiation in the same wavelength range, or can be embodied differently and thus emit light of different colors, for example. Preferably, the radiation-emitting component comprises for each laser diode chip exactly one transistor, which is assigned one-to-one to the laser diode chip, and for each laser diode chip a parallel connection of at least two capacitors assigned exclusively to said laser diode chip.

Advantageously, in the case of a radiation-emitting component described here, it is evident that as a result of the short signal paths between the drive electronics, that is to say the transistor, for example, and the laser diode chip, parameters of pulsed operation such as, for example, the pulse width and the rise and fall times of the laser pulses can be reduced. The use of a housing formed with a plastic makes it possible to realize a particularly cost-effective radiation-emitting component which can be produced particularly inexpensively for example in comparison with radiation-emitting components comprising metallic housings.

The radiation-emitting component described here is described in greater detail below on the basis of exemplary embodiments and the associated figures.

The schematic illustrations in FIGS. 1A, 1B, 2, 3, 4A, 4B, 5A, 5B and 6 show embodiments of radiation-emitting components described here, on the basis of which properties of a radiation-emitting component described here are explained in greater detail.

The graphical plots in FIGS. 7A and 7B serve for explaining properties of exemplary embodiments of radiation-emitting components described here.

In conjunction with the schematic illustrations in FIGS. 8A, 8B, 8C, 8D, 9A, 9B, 9C, 10, further exemplary embodiments of a radiation-emitting component described here are explained in greater detail.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1A shows a schematic perspective illustration of a radiation-emitting component described here. The radiation-emitting component comprises a metallic carrier body 1, which is formed with copper, for example, which can be coated with a metal such as silver or gold at its outer surfaces. The metallic carrier body is divided into a plurality of regions electrically insulated from one another (in this respect, also see the schematic perspective illustration in FIG. 3).

The active component parts of the radiation-emitting component are applied to the carrier body 1. By way of example, a laser diode chip 2, a transistor 5 and two capacitors 6 are applied on the carrier body. In this case, the transistor 5 serves for switching the laser diode chip 2, and the capacitors 6, which are connected in parallel with one another, serve for supplying energy. The radiation-emitting component is therefore suitable for generating laser pulses.

The radiation-emitting component furthermore comprises a housing 3, which surrounds the carrier body 1 in places. In this case, the carrier body 1 in places is embedded into the housing 3, for example encapsulated with the material of the housing 3 by injection molding.

In this case, the housing 3 can be formed with a plastics material, for example.

The housing 3 surrounds the metallic carrier body 1 in such a way that a cavity is formed, in which the active component parts of the radiation-emitting component are arranged.

The radiation-emitting component further comprises a radiation exit window 4, which is embodied as transparent, for example, to electromagnetic radiation generated by the laser diode chip 2 during the operation. In the exemplary embodiment shown in FIG. 1A, the housing 3 has a lowered side wall at a side face 3c, which is adjoined by the radiation exit window 4. Radiation exit window 4 also forms the top side of the radiation-emitting component, said top side facing away from a bottom face 3a, and there directly adjoins the remaining side faces of the housing 3.

The metallic carrier body 1 comprises a plurality of connection locations 1a, 1b which extend along the bottom face 3a and the side face 3b of the housing 3, said side face running transversely with respect to the bottom face. In this case, the connection locations 1a, 1b are freely accessible from outside the radiation-emitting component at the bottom face 3a of the housing and the side face 3b of the housing. The radiation-emitting component can therefore be mounted both at the bottom face 3a of the housing via the connection locations 1a and at the side face 3b of the housing via the connection locations 1b.

The connection locations 1a, 1b are formed by outer surfaces of the metallic carrier body 1. In order to produce connection locations both at the side face and at the bottom face of the housing 3, the metallic carrier body 1 has U-shaped bends which enclose a part of the housing 3 with their side facing away from the connection areas and directly adjoin the housing 3 there.

The shown embodiment of the metallic carrier body 1 enables the radiation-emitting component to be mounted in two different orientations by means of a surface-mounting technology. That is to say that the radiation-emitting component is surface-mountable in two different orientations.

Figure 2:
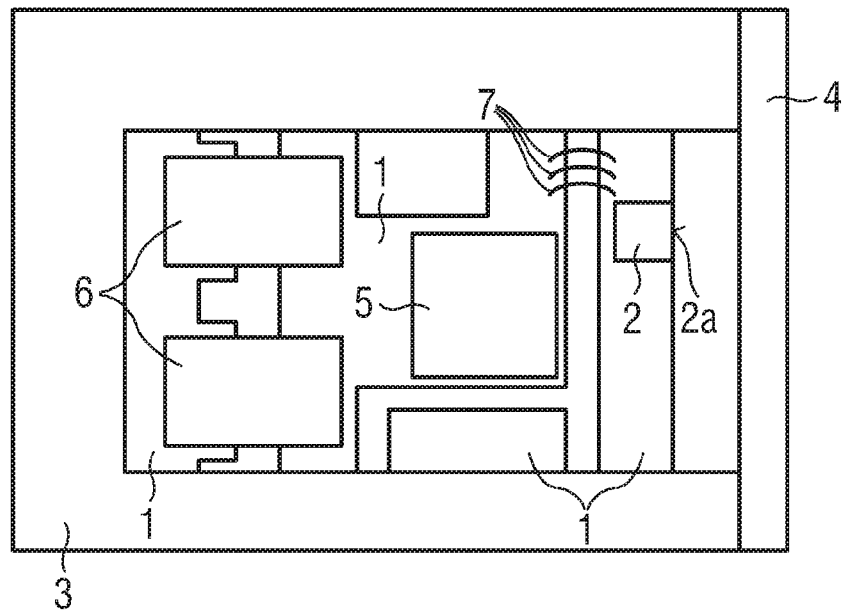

FIG. 2 shows a schematic plan view of one exemplary embodiment of a radiation-emitting component described here. In a manner supplementing FIGS. 1A and 1B, FIG. 2 reveals that the transistor is electrically conductively connected to the laser diode chip 2 by means of a plurality of contact wires 7. In this case, as shown in FIG. 2, the contact wires can extend from a part of the metallic carrier body 1 which is assigned to the transistor 5 to a part of the metallic carrier body 1 which is assigned to the laser diode chip 2. However, it is also possible for the contact wires to be fixed to the transistor 5 by one end and to the laser diode chip 2 by the other end.

Furthermore, FIG. 2 reveals that a radiation exit face 2a of the laser diode chip 2, from which radiation exit face electromagnetic radiation emerges from the laser diode chip during the operation thereof, faces the radiation exit window 4, such that the electromagnetic radiation emitted by the laser diode chip 2 during operation impinges on the radiation exit window 4.

Figure 3:
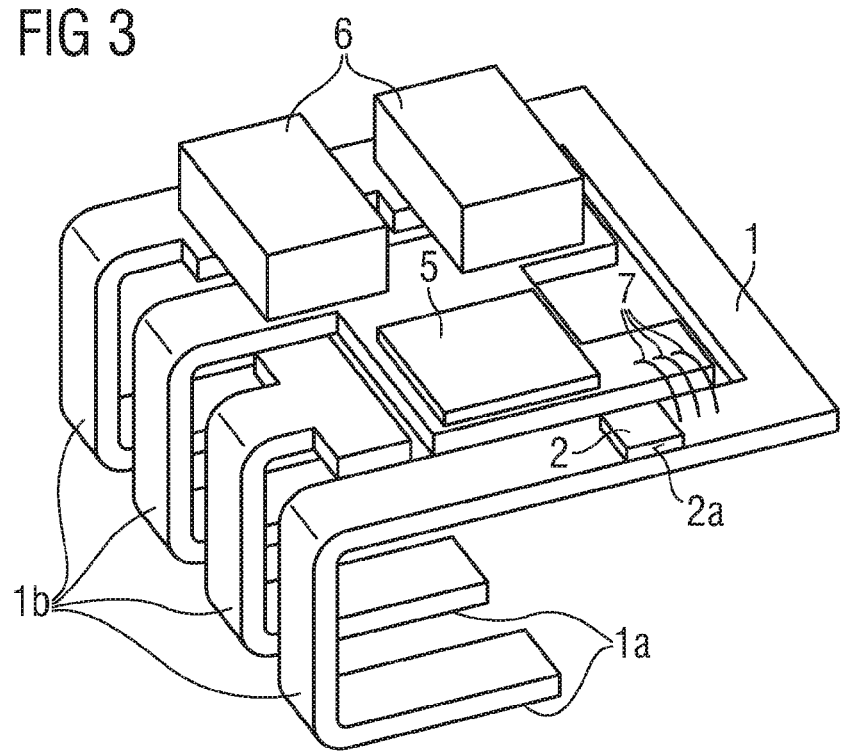
Figure 4A:
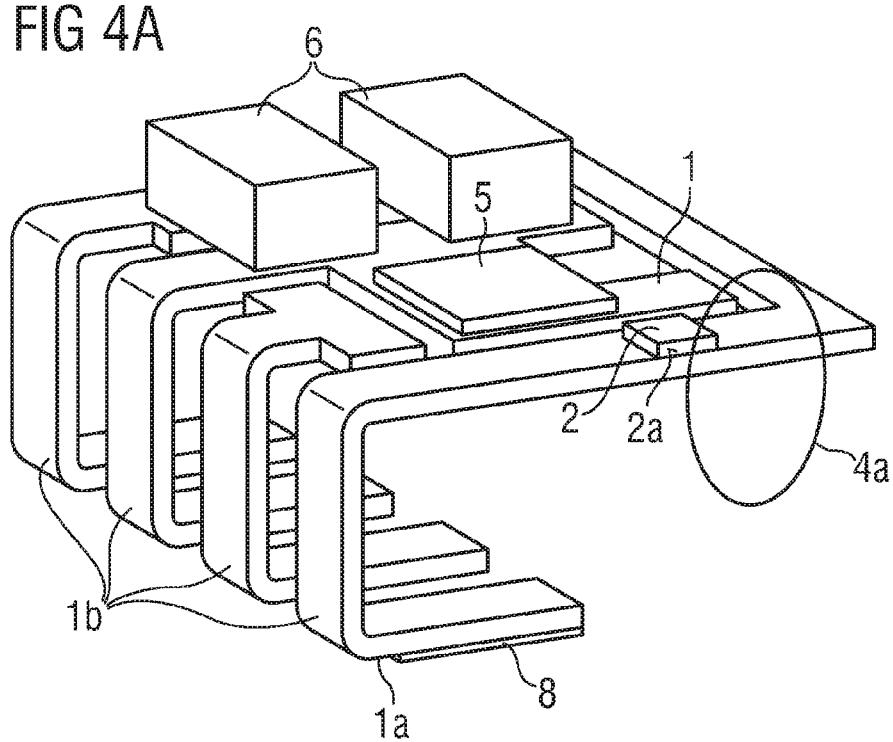
Figure 4B:
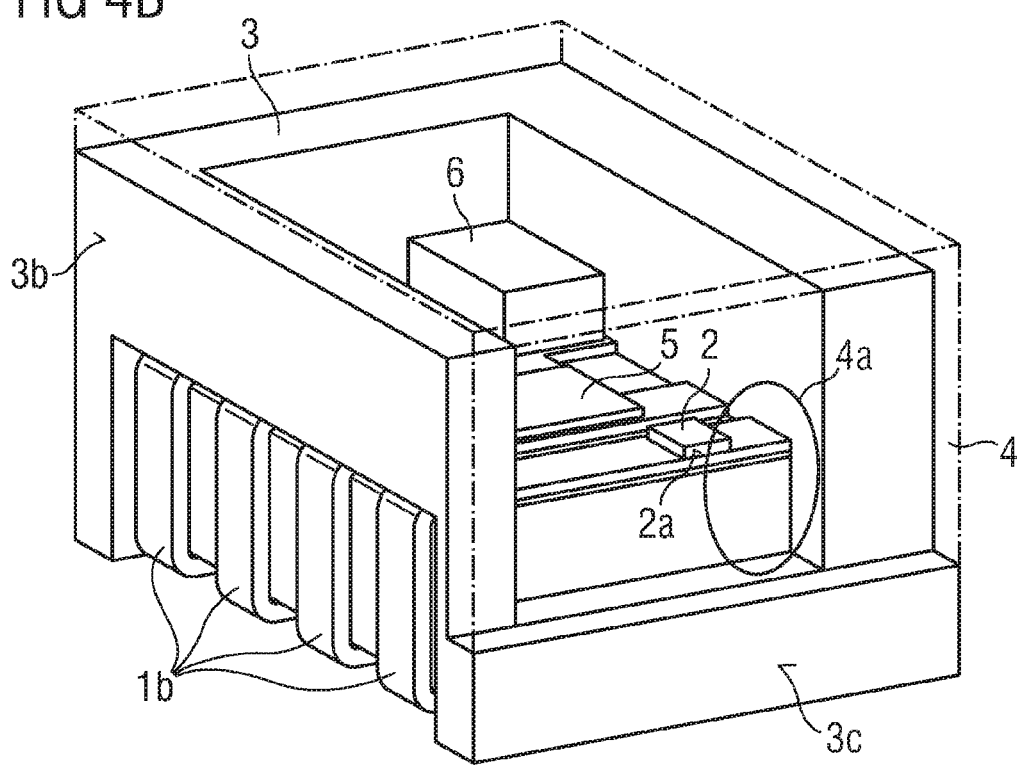

FIG. 3 shows, on the basis of a schematic perspective illustration, the radiation-emitting component without housing 3 and radiation exit window 4. The relative arrangement of the parts of the metallic carrier body 1 and of the active component parts 2, 5, 6 of the component with respect to one another can be discerned particularly well from this view. The active component parts 2, 5, 6 of the component can be fixed to assigned parts of the metallic carrier body 1 in each case by means of an electrically conductive adhesive, for example. In this case, the capacitors 6 are connected in parallel with one another via corresponding parts of the metallic carrier body. An electrical connection between the transistor 5 and the laser diode chip 2 is imparted via the contact wires 7.

In all of the embodiments and exemplary embodiments it is possible for the metallic carrier body 1 to comprise a main body which contains copper or consists of copper. By way of example, the main body can also be formed with a copper alloy, for example brass.

One or a plurality of layers of a further metal can then be deposited onto the main body of the carrier body 1 for example electrolytically or in an electroless fashion. By way of example, the following layers or layer sequences can be applied to the main body of the metallic carrier body in particular electrolytically: silver, nickel-silver, nickel-gold, nickel-palladium-gold.

In all of the embodiments and exemplary embodiments, the housing 3 of the radiation-emitting component described here can be formed with a plastic having high temperature resistance, such as PP, PPA, PPS, LCP, PEEK, epoxy resin.

In all of the embodiments and exemplary embodiments, the radiation exit window 4 can be formed with a glass, which can also comprise an antireflection coating. Furthermore, the radiation exit window 4 can be formed with an optically transparent plastic having high temperature resistance, such as epoxy resin, for example. Combinations of the two materials are also possible. In this regard, the exit window can comprise, for example, a radiation-transmissive region 4a (in this respect, also cf. FIG. 10), which is formed with glass, for example. Furthermore, the radiation passage window comprises a cover 4b, which can be formed with a radiation-opaque, for example black or colored, plastic having high temperature resistance, such as PP, PPA, PPS, LCP, PEEK or epoxy resin.

The different orientation during mounting of a radiation-emitting component described here are explained in greater detail in conjunction with the schematic perspective illustrations in FIGS. 4A, 4B and 5A, 5B. In the exemplary embodiment in FIGS. 4A and 4B, the bottom face 3a of the housing forms the mounting face of the radiation-emitting component. That is to say that a connecting means 8 such as a solder, for example, is applied to the connection locations 1a extending along the bottom face 3a of the housing. The laser diode chip 2 is thereby oriented in such a way that beam cone of the electromagnetic radiation generated by the laser diode chip during operation is larger perpendicularly to the printed circuit board on which the radiation-emitting component is fixed than in directions parallel to the printed circuit board.

Figure 5A:
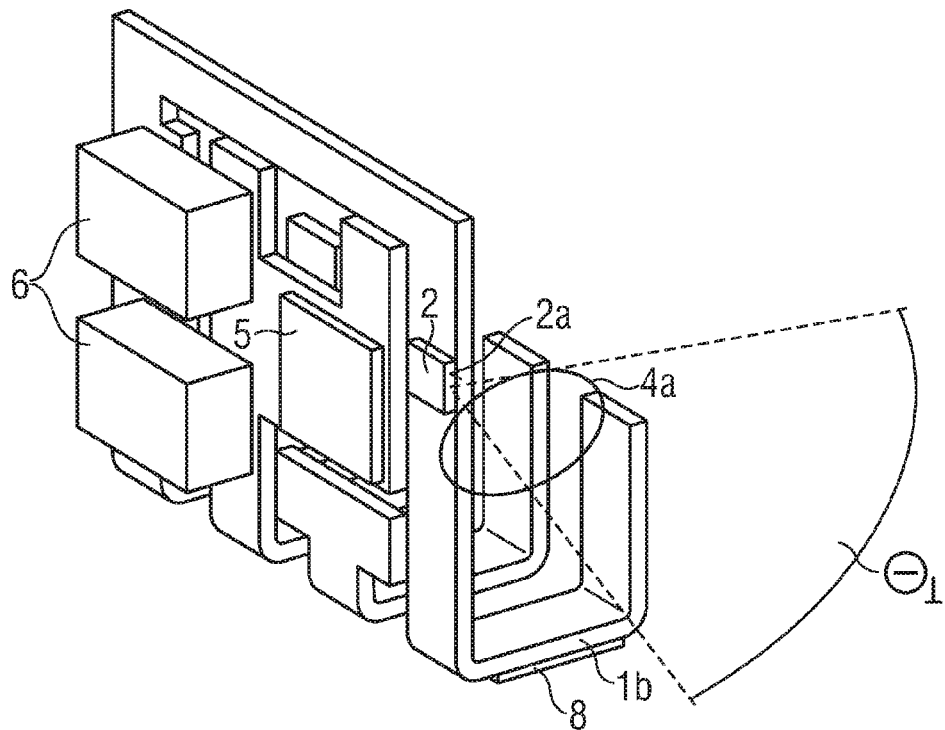
Figure 5B:
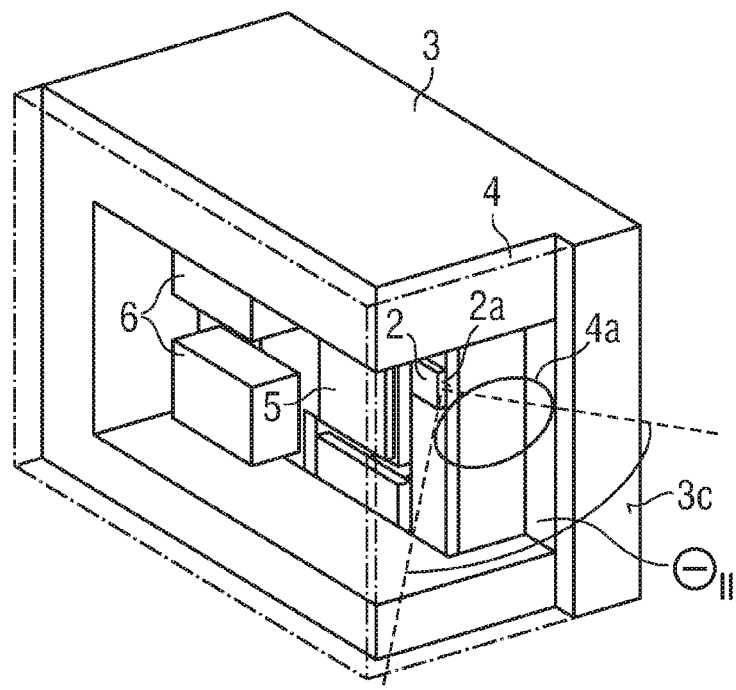

The opposite is true for the case shown in conjunction with FIGS. 5A and 5B, wherein the side face 3b running perpendicularly to the bottom face 3a of the housing 3 forms the mounting face of the component. In the orientation of the component relative to the mounting face as shown in FIG. 5A, a connecting means 8, for example a solder, is arranged between the connection locations 1b extending along the side face 3b and, for example, a printed circuit board on which the component is applied and electrically connected.

In conjunction with the schematic perspective illustration in FIG. 6, a radiation-emitting component is shown in which fitting pins 9 are formed both at the bottom face 3a and at the side face 3b of the housing 3. In this case, the fitting pins are an integral part of the housing 3 and produced with the housing 3 for example in the same production process as for said housing. During surface mounting of the radiation-emitting component, the fitting pins 3 can serve for aligning the component at the intended location, for example a printed circuit board. That is to say that the fitting pins 9 can engage into corresponding holes in, for example, a printed circuit board, as a result of which the radiation-emitting component can be mounted only at the location provided for it on the printed circuit board.

In all of the embodiments, the radiation exit window 4, at least in the region of the radiation passage 4a (in this respect, cf. FIGS. 4A, 4B, 5A, 5B), can have a roughening that is of the order of magnitude of the wavelength of the electromagnetic radiation generated by the laser diode during operation. Said roughening leads to a homogenization of the intensity profile in particular in the far field. The graphical plots in FIGS. 7A and 7B show in the far field the intensity I of the emitted radiation of the laser diode chip 2 with roughening (FIG. 7A) and without roughening (FIG. 7B) for the two different orientations, that is to say parallel to the pn junction and perpendicular to the pn junction. In this case, it is apparent that, for example, the occurrence of a double maximum (compare FIG. 7B, left-hand illustration with FIG. 7A, left-hand illustration) can be prevented.

In this case, the roughening of, for example, the outer surface of the radiation exit window 4 is fashioned in such a way that the unevennesses are statistically distributed and the size of the unevennesses of the roughening is of the order of magnitude of the wavelength of the light emitted by the laser chip diode 2 during operation.

Overall, a component described here is distinguished, in particular, by the following advantages:

The orientation of the different divergence angles of the radiation generated by the laser diode chip during operation can be selected in a simple manner by the component being correspondingly mounted on a printed circuit board. In this case, the component can be mounted onto the printed circuit board with the bottom face 3a of the housing 3 as mounting face or in a manner rotated by an angle of 90° with respect thereto. Further processing of the housing 3 or an adaptation of, for example, the printed circuit board is not necessary in this case.

Furthermore, the sole mechanical connection between the laser diode chip and the metallic carrier body 1 consists in an adhesive bond or soldered joint on the metallic carrier body 1. Exclusively air or some other gas is situated within the housing 3. Owing to the lack of potting of the laser diode chip, mechanical strains on the laser diode chip and negative effects associated therewith with regard to the reliability of the component are reduced.

As a result of the optimization of the electrical design, that is to say as a result of the active component parts being arranged close together spatially and as a result of the use of at least two capacitors 6, it is possible to improve the short-pulse behavior of the laser radiation emitted by the radiation-emitting component during operation. The radiation is then distinguished, in particular, by a particularly short pulse width and short rise times and fall times of the pulses.

Furthermore, in the present case, the tolerance-critical use of expensive metal housings is dispensed with and instead a more cost-effective housing 3 is used, which is formed in particular with a plastic. This results in improved tolerances that make it unnecessary for the optical system to be actively aligned. Particularly owing to the use of fitting pins 9 formed at the housing 3, it is possible to produce a positively locking connection to, for example, a printed circuit board onto which the radiation-emitting component is mounted. Furthermore, shifted positionings during the mounting process, for example a soldering process, are prevented by the fitting pins 9. The shifted positionings can be, for example, floating of the housing on the liquid solder or so-called tombstoning, that is to say tilting of the component during the hardening of the solder. The fitting pins 9 prevent these shifted positionings particularly effectively if they are introduced in the context of a press fit into corresponding holes in the printed circuit board on which the component is mounted.

Figure 8A:
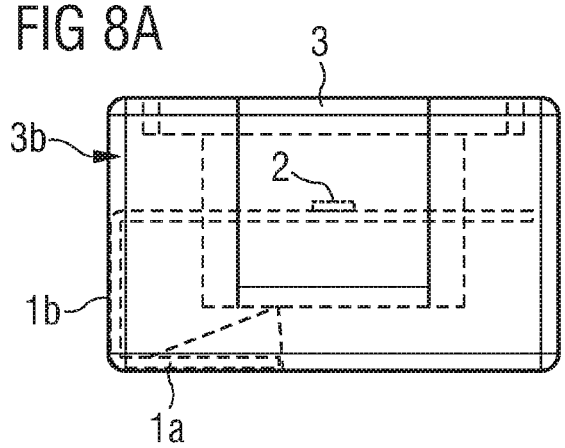
Figure 8B:
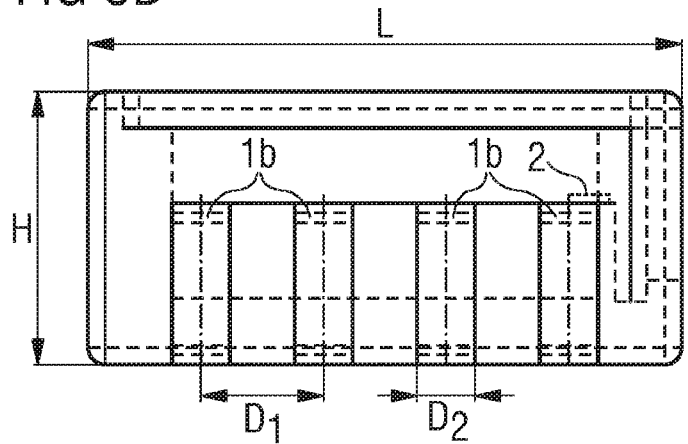
Figure 8C:
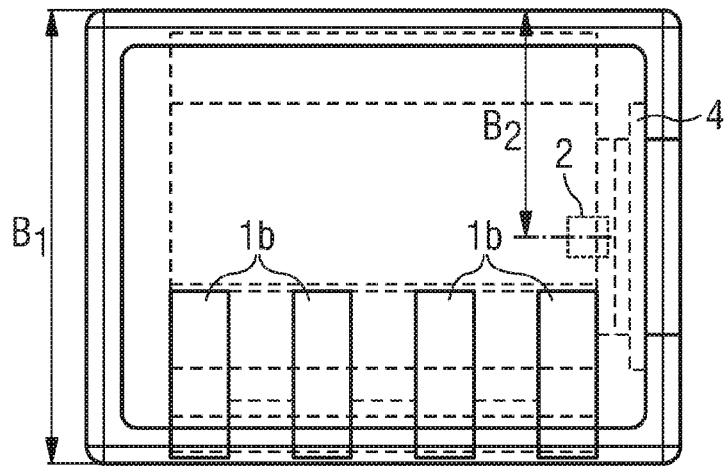

A further exemplary embodiment of a radiation-emitting component described here is explained in greater detail in conjunction with FIGS. 8A to 8D. In contrast to the previous exemplary embodiments, the radiation-emitting component comprises a bipartite radiation exit window. The radiation exit window 4 comprises a radiation-transmissive region 4a, which is formed with a glass, for example. Furthermore, the radiation exit window 4 comprises a cover 4b, which is arranged at the side of the component facing away from the bottom face 3a and which is formed with a plastic having high temperature resistance, such as PP, PPA, PPS, LCP, PEEK, epoxy resin. In this case, the cover 4b can be embodied as radiation-transmissive or radiation-opaque. Furthermore, FIGS. 8B and 8C show the length L, the height H, the width B1, the distance between laser diode chip 2 and the further side face 3c B2, the distance between the connection locations 1b D1 and the width of the connection locations D2. For example, the following values prove to be advantageous:

L=8.55 mm
H=3.85 mm
D1=1.75 mm
D2=0.80 mm
B1=6.45 mm
B2=3.225 mm

In this case, the values can fluctuate by ±20%, preferably by ±10%, around the values indicated.

Figure 8D:
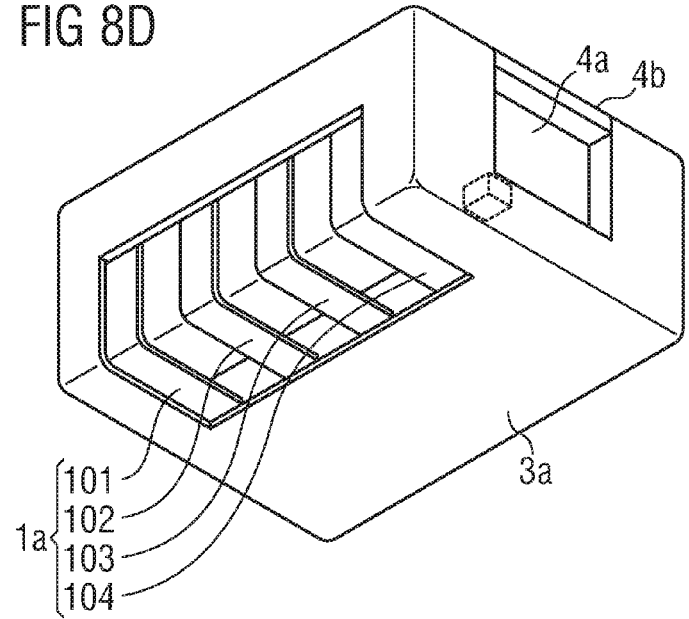

It is furthermore apparent from the schematic perspective illustration in FIG. 8D that the connection locations 1a, 1b can be accorded different functions. In this regard, the connection 101 can be provided for grounding the component, as can the connection 104. The connection 102 can serve for supplying voltage to the component, whereas the connection 103 is provided for an external driving of the radiation-emitting component.

Figure 9A:
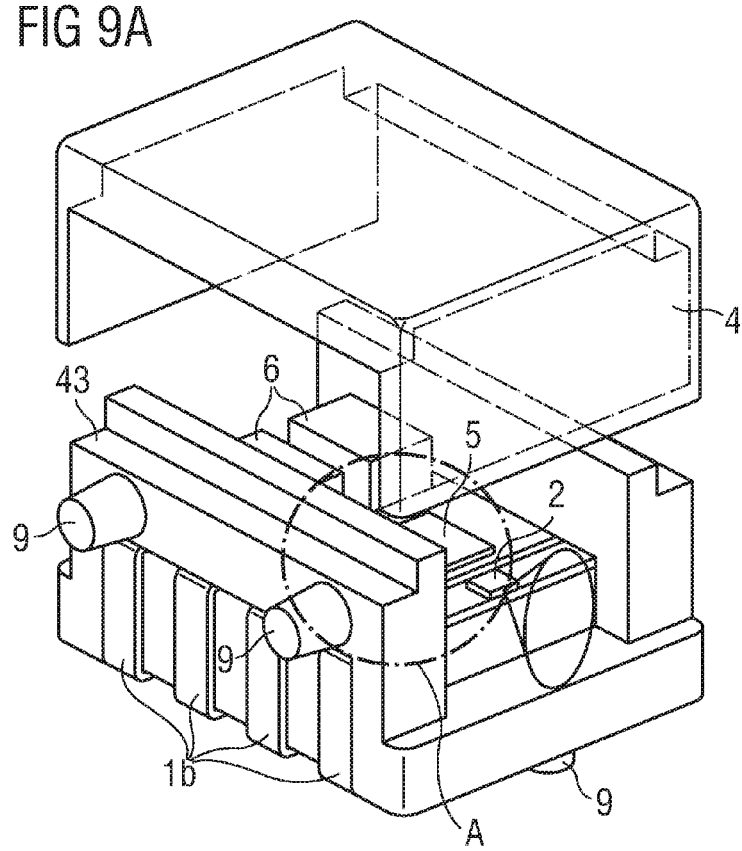
Figure 9B:
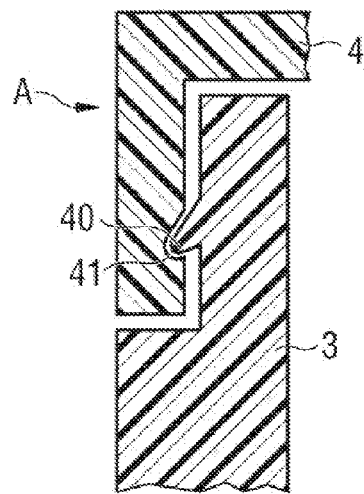
Figure 9C:
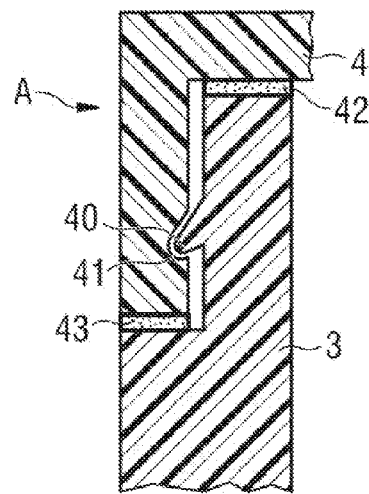

Various possibilities for fixing a one-piece radiation exit window 4 to the housing 3 are described in conjunction with the schematic illustrations in FIGS. 9A, 9B and 9C. In this case, the radiation exit window 4 is formed with a plastic having high temperature resistance, for example, which is radiation-transmissive. As is apparent from the sectional illustration in FIG. 9B, the housing 3 can have a protuberance 40 at a side facing the radiation exit window 4, said protuberance engaging into a corresponding indentation 41 of the radiation exit window 4. By way of example, a latching connection between the two component parts is made possible in this way. The protuberance 40 can then be a latching lug, in particular. This type of connection also enables a connection free of connecting means between the radiation exit window 4 and the housing 3.

It is additionally possible, as shown in FIG. 9C, for a connecting means 42, for example an adhesive, to be arranged between the plastic housing 3 and the radiation exit window 4. The connecting means 42 can be arranged for example on a projection 43 of the housing 3, said projection extending along a side face.

Figure 10:
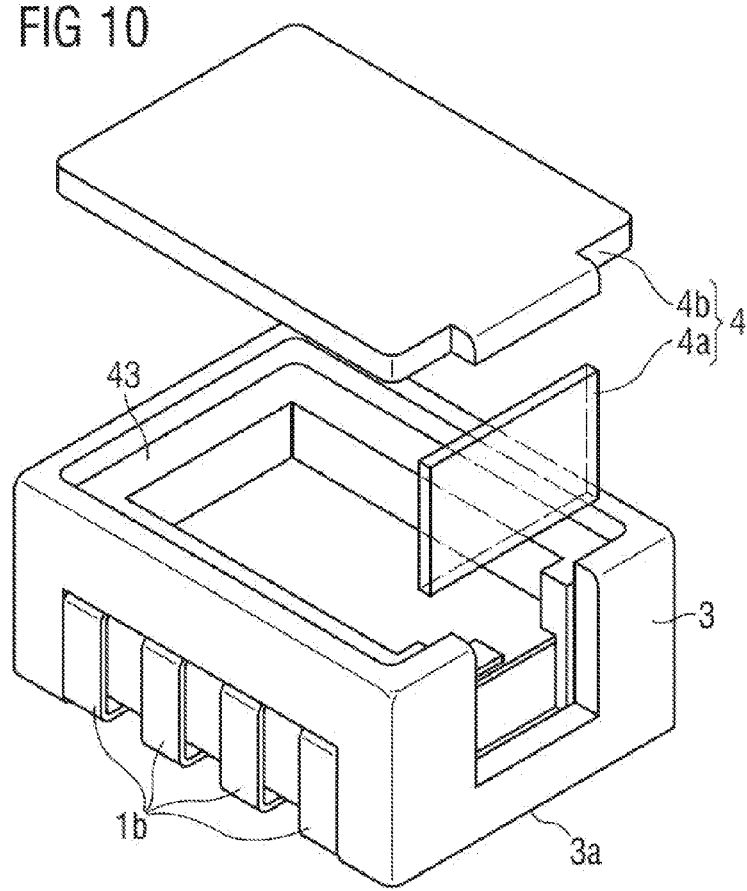

In conjunction with FIG. 10, an exemplary embodiment of a radiation-emitting component described here is explained in greater detail, wherein the radiation exit window 4 is embodied in a bipartite fashion. The radiation exit window 4 comprises a radiation-transmissive region 4a, which is disposed downstream of the laser diode chip 2 in the emission direction. Furthermore, the radiation exit window 4 comprises a cover 4b, which can be embodied as radiation-opaque. The radiation-opaque region 4 is embodied for example as a plate, for example a glass plate, which is inserted into an indentation or guide rails of the plastic housing 3.

The cover 4b has a projection that then presses the plate in the direction of the bottom face 3a of the plastic housing 3. The cover 4b can be fixed to a projection 43 of the plastic housing 3 by adhesive bonding for example by means of an adhesive. That is to say that the radiation exit window 4 is bipartite in the exemplary embodiment in FIG. 10. The cover 4b can consist, in particular, of the same material as the plastic housing 3. As an alternative to fixing by means of a connecting means, for example as an alternative to adhesive bonding, the cover 4b can also once again be fixed to the plastic housing 3 by a positively locking connection such as the latching connection described further above.

The invention is not restricted to the exemplary embodiments by the description on the basis of said exemplary embodiments. Rather, the invention encompasses only novel feature and also any combination of features, which in particular includes any combination of features in the patent claims, even if this feature or this combination itself is not explicitly specified in the patent claims or exemplary embodiments.

This patent application claims the priority of German patent application 102011116534.0, the disclosure content of which is hereby incorporated by reference.

The invention claimed is:

1. A radiation-emitting component having
a metallic carrier body, which comprises at least two connection locations for making electrical contact with the component,
a laser diode chip, which is fixed to the metallic carrier body and is electrically conductively connected to the at least two connection locations,
a housing, which surrounds the metallic carrier body in places, the housing having a bottom face, a side face and a further side face, the side faces running transversely with respect to the bottom face and with respect to each other, and
a radiation exit window at the further side face of the housing, the radiation exit window facing a radiation exit face of the laser diode chip, and the radiation exit window running transversely with respect to the bottom face,
wherein
an axis of a beam cone of the electromagnetic radiation generated by the component during operation runs transversely with respect to a respective mounting direction of the connection locations,
the housing is formed with a plastic,
the connection locations extend in each case at least in places along the bottom face and the side face of the housing,
the component is surface-mountable by means of the connection locations in such a way that the bottom face or the side face forms a mounting face of the component,
the component is mountable in two orientations at a target location in such a way that the beam cone is larger perpendicularly to the target location than in directions parallel to the target location in a first orientation, and smaller perpendicularly to the target location than in directions parallel to the target location in a second orientation,
the radiation exit window, at least in the region of a radiation passage of the electromagnetic radiation generated by the laser diode chip during operation, is transmissive to the radiation, and
the housing is not present in the region of the radiation exit window or the further side face is lowered relative to other side faces of the housing and is adjoined by the radiation exit window.

2. The radiation-emitting component according to claim 1, which is mountable in two orientations at a target location, wherein, in a first orientation, the bottom face forms the mounting face of the component and, in a second orientation, the side face running transversely with respect to the bottom face forms the mounting face of the component.

3. The radiation-emitting component according to claim 1, wherein
the radiation exit window, at least in the region of the radiation passage, has a mean roughness set in a targeted manner.

4. The radiation-emitting component according to claim 3, wherein the mean roughness is in a range of at least 0.5 to at most 1.5 of a peak wavelength of the radiation generated by the laser diode chip during operation.

5. The radiation-emitting component according to claim 1, wherein regions of the laser diode chip which do not face the metallic carrier body adjoin air or some other gas.

6. The radiation-emitting component according to claim 1, wherein the metallic carrier body is embedded into the housing in places.

7. The radiation-emitting component according to claim 1, wherein in each case at least one fitting pin is formed at the bottom face and at the side face of the housing.

8. The radiation-emitting component according to claim 7, wherein the at least one fitting pin is provided for alignment during mounting of the component.

9. The radiation-emitting component according to claim 1 having
a transistor for switching the laser diode chip, and
a parallel connection of at least two capacitors for supplying the laser diode chip with energy, wherein
the transistor and the capacitors are fixed on the metallic carrier and are electrically conductively connected to the at least two connection locations, and
the component is suitable for generating laser pulses.

10. The radiation-emitting component according to claim 9, wherein the transistor is electrically conductively connected to the laser diode chip via at least two contact wires.

11. A radiation-emitting component having
a metallic carrier body, which comprises at least two connection locations for making electrical contact with the component,
a laser diode chip, which is fixed to the metallic carrier body and is electrically conductively connected to the at least two connection locations,
a housing, which surrounds the metallic carrier body in places, the housing having a bottom face and a side face, the side face running transversely with respect to the bottom face,
a radiation exit window at a further side face of the housing, wherein the radiation exit window faces a radiation exit face of the laser diode chip,
wherein
the housing is formed with a plastic,
the connection locations extend in each case at least in places along the bottom face and the side face of the housing,
the component is surface-mountable by means of the connection locations in such a way that the bottom face or the side face forms a mounting face of the component,
the radiation exit window, at least in the region of a radiation passage of the electromagnetic radiation generated by the laser diode chip during operation, is transmissive to the radiation, and
the further side face is lowered towards the bottom face, relative to all other side faces of the housing and is adjoined by the radiation exit window.

* * * * *